United States Patent [19]

McKay

[11] 4,446,431
[45] May 1, 1984

[54] DOUBLE-TUNED SINGLE COIL PROBE FOR NUCLEAR MAGNETIC RESONANCE SPECTROMETER

[75] Inventor: Robert A. McKay, Ellis Ville, Mo.

[73] Assignee: Monsanto Company, St. Louis, Mo.

[21] Appl. No.: 295,940

[22] Filed: Aug. 24, 1981

[51] Int. Cl.³ ............................................ G01R 33/08
[52] U.S. Cl. .................................................... 324/318
[58] Field of Search ............... 324/300, 307, 308, 311, 324/318, 322

[56] References Cited

U.S. PATENT DOCUMENTS

| 3,795,855 | 3/1974 | Browning | 324/322 |
| 3,858,112 | 12/1974 | Satoh | 324/322 |
| 4,095,168 | 6/1978 | Hlavka | 324/322 |
| 4,129,822 | 12/1978 | Traficante | 324/322 |

OTHER PUBLICATIONS

"Single Coil Probe with Transmission-Line Tuning for Nuclear Magnetic Double Resonance", Rev. Sci. Instrum., vol. 47, No. 12, Dec. 1976, V. R. Cross, R. K. Hester, and J. S. Waugh, pp. 1406-1408.
"A Fast Recovery Probe and Receiver for Pulsed Nuclear Magnetic Resonance Spectroscopy", J. Scientific Instruments, (Journal of Physics E), 1968, Series 2, vol. 1, I. J. Lowe and C. E. Tarr.
"A Magic-Angle Spinning System for Bullet-Type Rotors in Electromagnets", J. Magnetic Resonance 42, 312-321, (1981), Victor J. Bartuska and Gary E. Maciel.
"The Design of a Single Coil Double Resonance NMR Probe for Combined Magic Angle Spinning Double Resonance Experiment", Paul D. Murphy and Bernard C. Gerstein, Ames Laboratory, DOE Iowa State University, Ames, Iowa.
"A Multinuclear Double-Tuned Probe for Applications with Solids or Liquids Utilizing Lumped Tuning Elements", J. Magnetic Resonance 43, 399-416, (1981), F. David Doty, Ruth R. Inners, and Paul D. Ellis.
"Simple Single-Coil Double Resonance NMR Probe for Solid State Studies,", Rev. Sci. Instrum., vol. 48, No. 7, Jul. 1977, M. E. Stoll, A. J. Vega, and R. W. Vaughan.

Primary Examiner—Michael J. Tokar
Attorney, Agent, or Firm—Joseph D. Kennedy; Larry R. Swaney

[57] ABSTRACT

A double-tuned single coil probe for a nuclear magnetic resonance spectrometer having improved sensitivity is described comprising a double-tuned circuit means in which the low frequency irradiation is fed to a transmission line through an inductor means. The double-tuned circuit means of the invention may be remotely disposed from the magnetic field which results in greater sensitivity.

8 Claims, 2 Drawing Figures

DOUBLE-TUNED SINGLE COIL PROBE FOR NUCLEAR MAGNETIC RESONANCE SPECTROMETER

This invention relates to nuclear magnetic resonance (NMR) spectrometers and more particularly to NMR spectrometers suitable for double-resonance experiments.

BACKGROUND OF THE INVENTION

For some NMR analyses, a sample is irradiated with radio frequency fields of two different frequencies at relatively high power levels, for example, 300–500 watts. It is important that good coupling to the sample be achieved at both frequencies. The efficiency of prior art probes is limited because of the size and magnetic restrictions for probe components. The present invention involves a double-tuned circuit which may be remotely disposed from the magnetic field which greatly reduces probe design problems because the size and magnetic restrictions for probe components are eliminated which results in enhanced sensitivity and a more efficient system.

SUMMARY OF THE INVENTION

In accordance with this invention, an improved double-tuned single coil probe for a nuclear magnetic resonance (NMR) spectrometer is provided in which all the tuning elements can be situated remote from the sample coil outside of the magnetic field. This permits high power levels without break down of components which is especially advantageous for solids experiments. The improved probe has excellent efficiency for both irradiation of the sample and detection of the induced nuclear resonance signals. The probe comprises a sample coil connected to a double-tuned circuit means comprising a high frequency irradiation means and a low frequency irradiation means. The two frequencies have a ratio of about at least three to one or more and are in the radio frequency (RF) range. The high frequency irradiation means is connected to the sample coil through a transmission line means comprising a transmission line of a length of about one half of the high frequency wavelength. A preferred transmission line is a coaxial cable transmission line, more preferably a low-loss coaxial cable transmission line. The low frequency irradiation means is connected to the sample coil through the aforesaid transmission line means through an inductor means connected to the transmission line at the point along the transmission line where the magnitude of the impedance for the high frequency irradiation is or about minimum.

It is understood that the probe is capable of sufficiently radiating a sample with both high and low frequency to excite the NMR of the sample nuclei at both frequencies and transmitting the signals generated by the sample NMR to a high frequency detection means and a low frequency detection means.

An important feature of the invention is an inductor means disposed between the high frequency means comprising a conventional coupling circuit, and the low frequency means comprising a conventional coupling circuit. An example of a suitable coupling circuit is a circuit containing fixed and variable capacitors by which tuning can be achieved. The inductor means, for example, an inductor coil, provides an inductive impedance to be matched to the impedance of the low frequency means to the impedance of the transmission line means. Thus, the low frequency irradiation means comprises an RF generator connected to the inductor means through a capacitive tuning and matching circuit. The high frequency irradiation means comprises an RF generator connected to the transmission line through a capacitive tuning and matching circuit which circuit also contains a low frequency trap.

These and other features of the invention will become more apparent by referring to the drawings and descriptions thereof.

DESCRIPTION OF THE PREFERRED EMBODIMENTS

Figure 1:
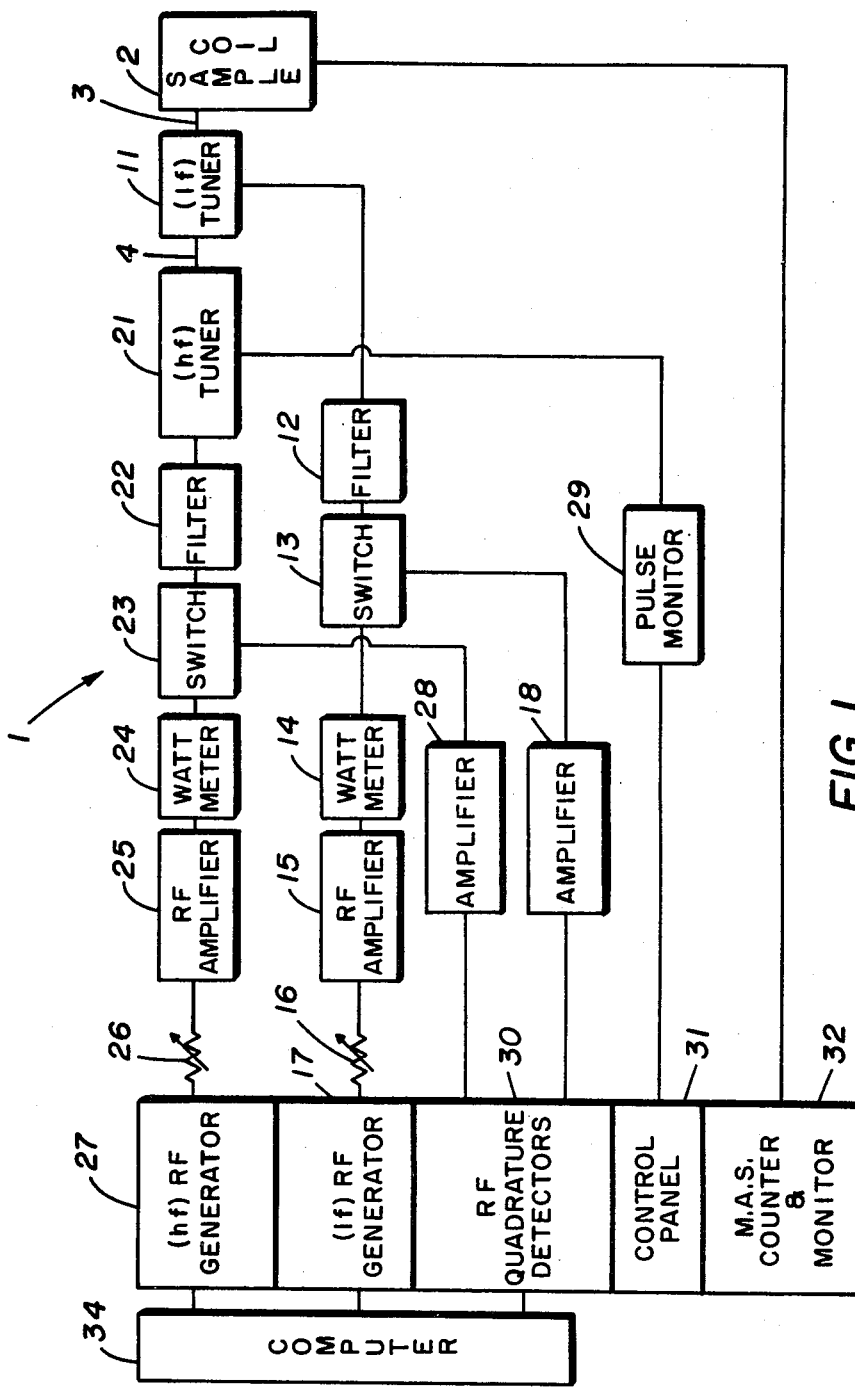
FIG. 1 is a schematic view in block diagram form of the major components of an NMR spectrometer containing the improved probe of the present invention.

Referring to FIG. 1, there is shown a double-tuned NMR spectrometer 1 of the invention. Spectrometer 1 includes a sample coil 2 for exciting and detecting the NMR of the sample under analysis. Signals are transmitted to and from sample coil 2 through transmission line segments 3 and 4. Input excitation low frequency (lf) RF irradiation is fed to transmission line segment 3 through a circuit comprising tuner 11 and filter 12. The remainder of the lf input RF circuit comprises switch 13 connected to watt meter 14 connected to RF amplifier 15 which amplifier 15 connects through attenuator 16 to low frequency RF generator 17. The portion of the circuit from sample coil 2 through switch 13 also serves as part of the output low frequency RF detection system. From switch 13 the low frequency RF NMR output passes through amplifier 18 to RF quadrature detectors 30.

Input excitation high frequency (hf) RF irradiation is fed to transmission line segment 4 through a circuit comprising tuner 21 and filter 22. Tuners 11 and 21, transmission line segments 3 and 4, and sample coil 2 comprise the probe circuit. The remainder of the hf input RF circuit comprises switch 23 connected to watt meter 24 connected to RF amplifier 25 which amplifier 25 connects through attenuator 26 to high frequency RF generator 27. The portion of the circuit from sample coil 2 through switch 23 also serves as part of the output high frequency RF detection system. From switch 23 the high frequency RF NMR output passes through amplifier 28 to RF quadrature detectors 30. A circuit also connects tuner 21 through RF pulse monitor 29 to control panel and oscilloscope system 31. Associated with control panel and oscilloscope system 31 is Magic Angle Spinner counter and monitor 32. Computer 34 capable of Fourier Transform analysis is connected to RF generators 17 and 27 and RF quadrature detectors 30.

Figure 2:
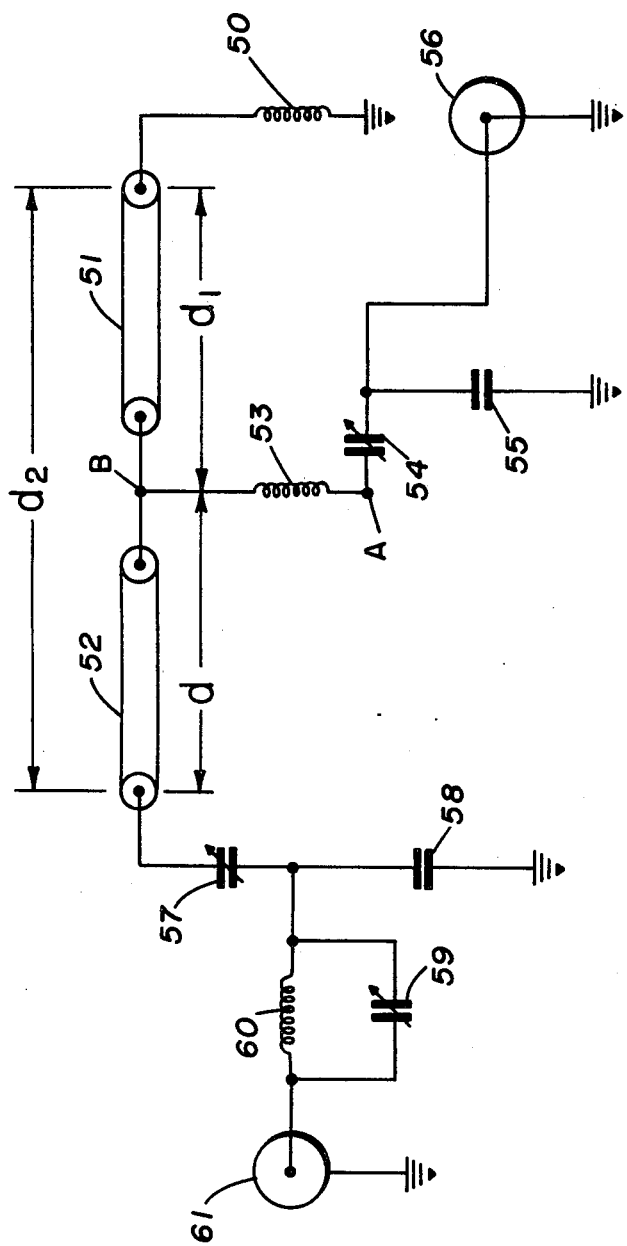
FIG. 2 is a detailed circuit diagram illustrating an embodiment of the improved probe of the invention.

A double-tuned single coil probe illustrative of an embodiment of the invention is shown in FIG. 2. Sample coil 50 receives and transmits RF signals through a transmission line having a length $d_2$ of about $\lambda/2$, where $\lambda$ is the wavelength of the high frequency irradiation. The transmission line comprises segment 51 of length $d_1$ and segment 52 of length d. Length $d_1$ is critical and determines the location of Junction Point B where the low frequency input and detection circuit connects with the aforesaid transmission line. Junction Point B must be located along the transmission line where the high frequency impedance is or about minimum. A method for calculating the location of Junction Point B and the corresponding length $d_1$ are described below. A low frequency circuit suitable for Carbon-13 irradiation comprises 22.6 Megahertz input port 56 adapted for a characteristic impedance, for example, 50 ohms, and a conventional coupling circuit comprising grounded capacitor 55 and variable capacitor 54 which coupling circuit is connected at point B through high Q inductor coil 53. A Q value as high as possible is desirable, but a Q value of at least 200 is satisfactory. Inductor coil 53 has sufficient inductance so that the impedance at point A looking toward Junction point B is inductive. Thus. the low frequency RF generator connects inductor coil 53 through a capacitive tuning and matching circuit. Although inductor coil 53 is illustrated in series, a suitable alternative comprises connecting an inductor coil in parallel at point B and impedance matching by tapping the inductor at the appropriate point.

A high frequency circuit suitable for proton irradiation comprises a 90 Megahertz input port 61 adapted for a characteristic impedance, for example, 50 ohms, and a conventional coupling circuit comprising grounded capacitor 58 and variable capacitor 57. A trapping circuit for isolating low frequency irradiation comprising variable capacitor 59 in parallel with inductor coil 60 is connected between the high frequency generator and the coupling circuit.

Junction Point B where the minimum impedance occurs can be calculated from the transmission line equation 1.

$$Z_s = Z_o \frac{Z_r \cosh \gamma d_1 + Z_o \sinh \gamma d_1}{Z_o \cosh \gamma d_1 + Z_r \sinh \gamma d_1} \quad \text{(Eq. 1)}$$

Where $Z_s$ is the input impedance for a transmission ine of length $d_1$, $Z_r$ the receiving end impedance, in this case the sample coil 50, $Z_o$ the characteristic impedance of the transmission line segment 51, and $\gamma = \alpha + j\beta$ where $\alpha$ is the attenuation constant in Nepers/unit length of the transmission line and $\beta = 2\pi/\lambda$, where $\lambda$ is the wavelength of the high frequency irradiation in the transmission line.

As an example, for an NMR spectrometer operating at a high frequency of 90 MHz, a transmission line with $Z_o = 50$ ohms (RG-225/U) and a sample coil with an inductance of 0.64 $\mu$h and a Q of 200, Junction Point B can be calculated. If the sample coil inductor is assumed to be purely reactive and the transmission line lossless ($\alpha = 0$) then Eq. 1 can be simplified and $d_1/\lambda$ is equal to 0.272 or $d_1 = 0.272\lambda$.

The error involved by assuming that $Z_s$ is purely inductive and the transmission line lossless. is that a zero null is implied, whereas, actually a finite but low value exists. However, at Junction Point B there is a minimum voltage and low impedance which means it is the least sensitive spot to connect the low frequency circuit provided the added circuit's impedance is 10 or more times the impedance at point B. Impedance measurements indicated that the impedance at point B is less than about 5 ohms.

Alernatively. Junction Point B may be located experimentally by use of an RF impedance meter or volt meter.

The probe of the invention gives a high operating Q resulting in a good signal-to-noise ratio. provides uniformity of irradiation at both frequencies since only a single coil is used, reduces design problems in the magnet gap since many of the circuit components may be located outside the magnetic field, and eliminates break down problems which occur in crossed coil systems.

Although the invention has been illustrated by typical examples, it is not limited thereto. Changes and modifications of the examples of the invention herein chosen for purposes of disclosure can be made which do not constitute departure from the spirit and scope of the invention.

The embodiments of the invention in which an exclusive property or privilege is claimed are defined as follows:

1. A double-tuned single coil probe for a nuclear magnetic resonance (NMR) spectrometer which probe comprises a sample coil connected to a double-tuned circuit means comprising a high frequency irradiation means and a low frequency irradiation means in which the two frequencies have a ratio of about at least three to one or more and are in the radio frequency (RF) range, in which the high frequency irradiation means is connected to the sample coil through a transmission line means comprising a transmission line of a length of about one half of the high frequency wavelength, and the low frequency irradiation means is connected to the sample coil through the aforesaid transmission line means through an inductor means connected to the transmission line at the point of about minimum impedance for the high frequency radiation.

2. The probe of claim 1 comprising a probe which sufficiently radiates a sample with both high and low frequency radiation to excite the NMR of the sample nuclei at both frequencies and transmits the signals generated by the sample NMR to a high frequency detection means and a low frequency detection means.

3. The probe of claim 2 comprising an inductor means which provides an inductive impedance to match the impedance of the low frequency means to the impedance of the transmission line means.

4. The probe of claim 3 in which the low frequency irradiation means comprises an RF generator connected to the inductor means through a capacitive tuning and matching circuit.

5. The probe of claim 4 in which the high frequency irradiation means comprises an RF generator connected to the transmission line through a capacitive tuning and matching circuit.

6. The probe of claim 5 in which the transmission line is a coaxial cable transmission line.

7. The probe of claim 6 in which the double-tuned circuit means is remotely disposed from the magnetic field.

8. The probe of claim 7 in which the inductor means is an inductor coil.

* * * * *